(12) United States Patent
Bai et al.

(10) Patent No.: US 7,259,079 B2
(45) Date of Patent: *Aug. 21, 2007

(54) METHODS FOR FILLING HIGH ASPECT RATIO TRENCHES IN SEMICONDUCTOR LAYERS

(75) Inventors: Jingyi Bai, Boise, ID (US); Weimin Li, Boise, ID (US); William S. Budge, Homedale, ID (US)

(73) Assignee: Micron Technology, Inc., Boise, ID (US)

( * ) Notice: Subject to any disclaimer, the term of this patent is extended or adjusted under 35 U.S.C. 154(b) by 301 days.

This patent is subject to a terminal disclaimer.

(21) Appl. No.: 11/047,476

(22) Filed: Jan. 31, 2005

(65) Prior Publication Data

US 2005/0158965 A1    Jul. 21, 2005

Related U.S. Application Data

(63) Continuation of application No. 10/618,220, filed on Jul. 11, 2003, now Pat. No. 6,982,207.

(51) Int. Cl.
| H01L 21/76 | (2006.01) |
| H01L 21/336 | (2006.01) |
| H01L 21/4763 | (2006.01) |
| H01L 21/31 | (2006.01) |
| H01L 21/469 | (2006.01) |

(52) U.S. Cl. ............... 438/424; 438/763; 438/296; 438/624

(58) Field of Classification Search .......... 438/763, 438/958, 424, 296, 624
See application file for complete search history.

(56) References Cited

U.S. PATENT DOCUMENTS

| 5,872,058 | A | 2/1999 | Van Cleemput et al. |
| 5,908,672 | A | 6/1999 | Ryu et al. |
| 6,030,881 | A | 2/2000 | Papasouliotis et al. |
| 6,048,775 | A | 4/2000 | Yao et al. |
| 6,129,819 | A | 10/2000 | Shan et al. |
| 6,194,038 | B1 | 2/2001 | Rossman |
| 6,200,911 | B1 | 3/2001 | Narwankar et al. |
| 6,211,040 | B1 | 4/2001 | Liu et al. |
| 6,245,641 | B1 | 6/2001 | Shiozawa et al. |
| 6,274,933 | B1 | 8/2001 | Abdelgadir et al. |
| 6,300,219 | B1 | 10/2001 | Doan et al. |
| 6,319,796 | B1 | 11/2001 | Laparra et al. |
| 6,365,015 | B1 | 4/2002 | Shan et al. |
| 6,395,150 | B1 | 5/2002 | Van Cleemput et al. |
| 6,559,026 | B1 | 5/2003 | Rossman et al. |

(Continued)

*Primary Examiner*—Chuong Anh Luu
(74) *Attorney, Agent, or Firm*—Dinsmore & Shohl LLP

(57) ABSTRACT

Methods of filling high aspect ratio trenches in semiconductor layers are provided. The methods utilize HDP-CVD processes to fill trenches with trench filling material. In the methods, the gas flow and RF bias are selected to provide a high etch to deposition ratio, while the trenches are partially filled. The gas flow and RF bias are then selected to provide a low etch to deposition ratio while the trenches are completely filled. It is emphasized that this abstract is provided to comply with the rules requiring an abstract which will allow a searcher or other reader to quickly ascertain the subject matter of the technical disclosure. It is submitted with the understanding that is will not be used to interpret or limit the scope or meaning of the claims.

26 Claims, 4 Drawing Sheets

U.S. PATENT DOCUMENTS

| | | |
|---|---|---|
| 6,596,654 B1 | 7/2003 | Bayman et al. |
| 6,982,207 B2 * | 1/2006 | Bai et al. .................... 438/424 |
| 2002/0040764 A1 | 4/2002 | Kwan et al. |
| 2002/0081817 A1 | 6/2002 | Bhakta et al. |
| 2003/0013270 A1 | 1/2003 | Seitz |
| 2003/0162363 A1 | 8/2003 | Ji |
| 2003/0207580 A1 | 11/2003 | Li et al. |
| 2003/0216006 A1 | 11/2003 | Li et al. |
| 2003/0235975 A1 | 12/2003 | Tran |

* cited by examiner

METHODS FOR FILLING HIGH ASPECT RATIO TRENCHES IN SEMICONDUCTOR LAYERS

CROSS REFERENCE TO RELATED APPLICATIONS

This application is a continuation of U.S. patent application Ser. No. 10/618,220, filed Jul. 11, 2003 now U.S. Pat No. 6,982,207.

BACKGROUND OF THE INVENTION

The present invention relates to a method for improving dielectric deposition and trench fill in semiconductor substrates or layers utilizing high-density plasma chemical vapor deposition (HDP-CVD). More particularly, the present invention is directed toward a method and system for improving the trench fill in trenches having high aspect ratios such as shallow trench isolation (STI) structures and intermetal dielectric (IMD) structures.

Chemical vapor deposition (CVD) has been used extensively to deposit dielectric material in trenches. During deposition, dielectric material will collect on the corners of the trenches, and overhangs will form at the corners. These overhangs typically grow together faster than the trench is filled, and a void in the dielectric material filling the gap is created. Many techniques have been utilized in attempts to solve the trench fill problem.

One technique which attempts to solve this problem is deposition and simultaneous etch back of the dielectric layer. This technique may be accomplished using high density plasma chemical vapor deposition (HDP-CVD). Typically, HDP-CVD is carried out in a process chamber. Precursor gases such as silane and oxygen are flowed into the chamber along with an inert gas. A plasma is formed in a reaction zone proximate to the surface of the substrate by the application of radio frequency (RF) energy. The deposition gases disassociate and react to form a silicon dioxide layer. The relatively non-reactant inert gas is ionized and used to etch the silicon dioxide layer during deposition to keep the gaps open. The flow rates, RF power and other parameters are typically controlled to produce the desired rate of deposition and etch. In this manner, trenches in a semiconductor substrate may be successfully filled.

However, such techniques do not always produce a void free trench fill for high aspect ratio trenches. For example, one technique for high aspect ratio trenches involves depositing the silicon dioxide layer in a two-step fashion. In the first step, the silicon dioxide is deposited using a low etch to deposition ratio. In the second step, the silicon dioxide is deposited using a high etch to deposition ratio. However, this approach may not be successful because the first layer of silicon dioxide may be too thin and be etched away during the second step. Alternatively, the first layer of silicon dioxide may be too thick and may narrow or close the trenches causing the formation of voids that are not deeply buried. These voids may be opened in later chemical mechanical polishing (CMP) processing steps. Additionally, these HDP-CVD processes can cause nitride liner layer erosion because the nitride portion of STI trenches may be undesirably etched.

Therefore, there is a need for a method of HDP-CVD that can produce high quality trench fill for trenches having a high aspect ratio in semiconductor layers. Additionally, there is a need for a method of HDP-CVD that does not cause substantial erosion of layers in or around high aspect ratio trenches.

SUMMARY OF THE INVENTION

This need is met by the present invention that provides methods for filling high aspect ratio trenches.

In accordance with an embodiment of the present invention, a method for filling a trench in a semiconductor layer located in a process chamber is provided. The method comprises flowing a first gas flow into the process chamber, forming a first plasma from the first gas flow, and applying a first RF bias to the semiconductor layer. The first gas flow and the first RF bias are selected such that the trench is partially filled with a first layer of trench filling material at a first etch/dep ratio. The method further comprises flowing a second gas flow into the process chamber, forming a second plasma from the second gas flow, and applying a second RF bias to the semiconductor layer. The second gas flow and the second RF bias are selected such that the trench is filled with a second layer of trench filling material at a second etch/dep ratio. The first etch/dep ratio is selected to be higher than the second etch/dep ratio.

In accordance with another embodiment of the present invention, a method of filling shallow trench isolation trenches in a semiconductor substrate located in a process chamber is provided. The method comprises flowing a first gas flow into the process chamber, forming a first plasma from the first gas flow, and applying a first RF bias to the semiconductor substrate. The first gas flow and the first RF bias are selected such that the shallow isolation trenches are partially filled with a first layer of trench filling material at a first etch/dep ratio. The method further comprises flowing a second gas flow into the process chamber, forming a second plasma from the second gas flow, and applying a second RF bias to the semiconductor substrate. The second gas flow and the second RF bias are selected such that the shallow trench isolation trenches are filled with a second layer of trench filling material at a second etch/dep ratio. The first etch/dep ratio is selected to be higher than the second etch/dep ratio.

In accordance with another embodiment of the present invention, a method of filling trenches in a semiconductor layer by HDP-CVD is provided. The method comprises: forming a first plasma from a first gas flow, wherein the first gas flow has a flow rate; applying a first RF bias to the semiconductor layer; and exposing the semiconductor layer to the first plasma. The step of exposing the semiconductor layer to the first plasma causes deposition of a first layer of trench filling material in the trenches. The first gas flow rate and the first RF bias are selected such that the deposition of the first layer of trench filling material occurs at a first etch/dep ratio. The method further comprises: forming a second plasma from a first gas flow, wherein the second gas flow has a flow rate; applying a second RF bias to the semiconductor layer; and exposing the semiconductor layer to the second plasma. The step of exposing the semiconductor layer to the plasma causes deposition of a second layer of trench filling material in the trenches. The second gas flow rate and the second RF bias are selected such that the deposition of the second layer of trench filling material occurs at a second etch/dep ratio, and the first etch/dep ratio is selected to be higher than the second etch/dep ratio.

DETAILED DESCRIPTION OF THE PREFERRED EMBODIMENTS

Figure 1A:
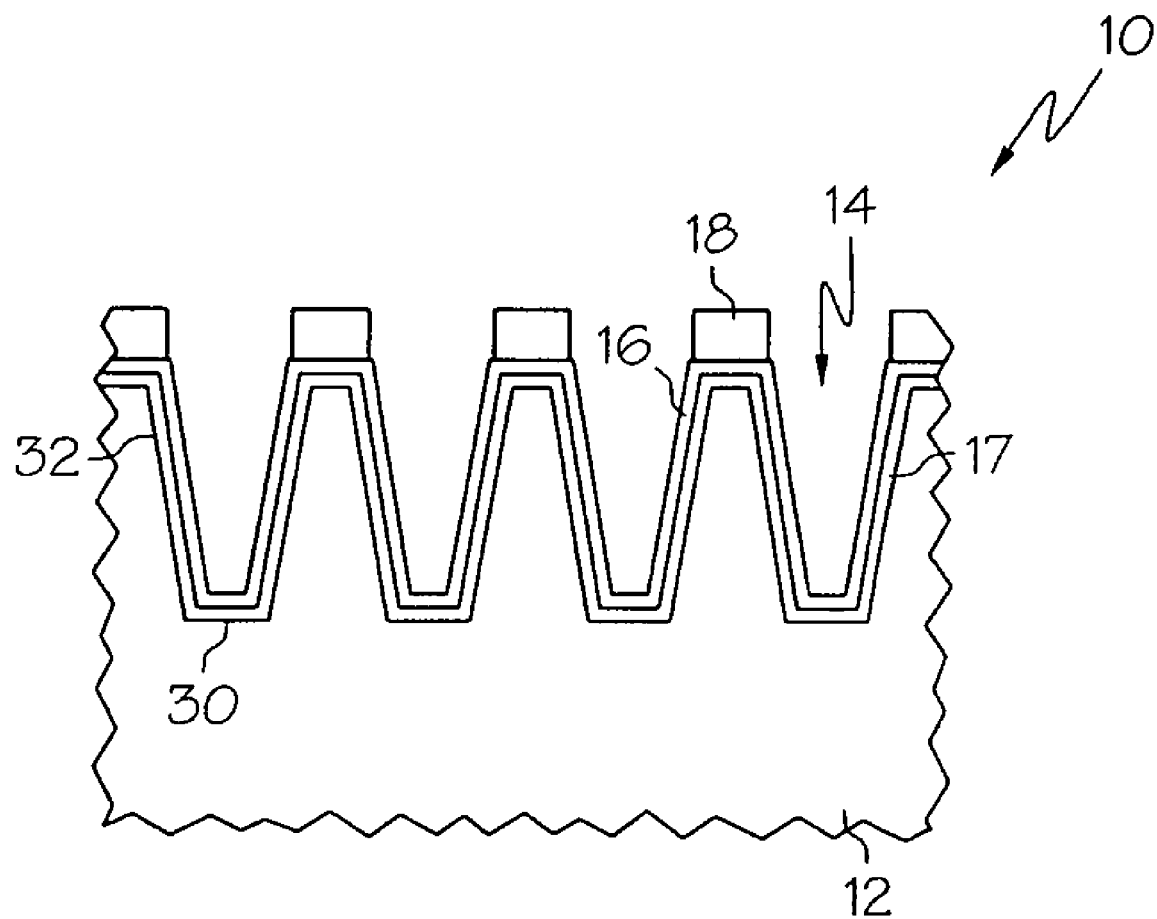
FIGS. 1A-1C are cross-sectional views of trenches being filled in accordance with an embodiment of the present invention.

The present invention is directed to a method of filling trench regions in semiconductor devices. The method utilizes a two-step deposition of dielectric material to produce a filled trench substantially free of voids or having deeply buried voids. For purposes of defining and describing the present invention, "deeply buried voids" will be understood as referring to a void that is not exposed during subsequent processing steps.

In the following detailed description of the preferred embodiments, reference is made to the accompanying drawings that form a part hereof, and in which is shown by way of illustration, and not by way of limitation, specific preferred embodiments in which the invention may be practiced. It is to be understood that other embodiments may be utilized and changes may be made without departing from the spirit and scope of the present invention. In the drawings, like numerals describe substantially similar components throughout the several views.

Referring to FIG. 1A, a semiconductor layer 10 comprising a semiconductor substrate 12 having trenches 14 is illustrated. For purposes of defining and describing the present invention, the term "semiconductor substrate" is defined to mean any construction comprising semiconductive material, including, but not limited to, bulk semiconductive material such as a semiconductive wafer, either alone or in assemblies comprising other materials thereon, and semiconductive material layers, either alone or in assemblies comprising other materials. The term "substrate" refers to any supporting structure including, but not limited to, the semiconductor substrates described above.

The trenches 14 may be formed in any suitable manner. For example, the trenches 14 may be formed by an STI trench method. Alternatively, the trenches may be intermetal dielectric trenches formed between adjacent conductive metal traces or the like. Generally, the trenches 14 are high aspect ratio trenches having an aspect ratio of between about 6:1 to about 10:1. When the trenches 14 are formed by an STI trench method, the trenches 14 may have an oxide layer 17 and a nitride liner layer 16 overlying the bottom 30 and sidewalls 32 of the trenches 14. Additionally, there may be islands of nitride 18 between the trenches 14.

Referring to FIGS. 1A-1C and 2, a method 220 for filling the trenches 14 is illustrated. The method includes the step 222 of providing the semiconductor layer 10 in a process chamber. The process chamber may be any suitable chamber for forming a high density plasma. For example, the process chamber may be a Novellus Concept Two Speed® chamber available from Novellus Systems, Inc., San Jose, Calif. A first gas flow is flowed into the process chamber in step 224, and a first plasma is formed from the first gas flow in step 226. Generally, the first plasma is formed by applying a low frequency radio frequency (LFRF) power to the gas flow. A first RF bias is applied to the semiconductor layer 10 in step 228, and the trenches 14 are partially filled with a first layer of trench filling material 20 from the first plasma in step 230. The first layer of trench filling material 20 may generally be any suitable dielectric material. For example, the first layer of trench filling material 20 may be silicon dioxide.

The first RF bias causes some of the ionized molecules in the first plasma to accelerate toward and strike the semiconductor layer 10. Material from the first layer of trench filling material 20 is etched when the ionized molecules strike the semiconductor layer 10. Therefore, the first layer of trench filling material 20 is simultaneously etched and deposited in step 230.

After the trenches 14 have been partially filled, a second gas flow is flowed into the process chamber in step 232. A second plasma is formed from the second gas flow in step 234, and a second RF bias is applied to the semiconductor layer 10 in step 236. Finally, the trenches 14 are filled with a second layer of trench filling material 22 from the second plasma in step 238. The second layer of trench filling material 22 may generally be any suitable dielectric material, such as silicon dioxide. It will be understood that the first and second gas flows may be the same or different gas flows. It will be further understood that the first and second layers 20, 22 may be the same or different.

During step 230, the first gas flow and the first RF bias are selected such that the trenches 14 are filled with the first layer of trench filling material 20 at a first etch to deposition (etch/dep) ratio. The etch/dep ratio may be defined by the equation:

$$\text{etch/dep} = (R_s - R_b)/R_s$$

where $R_s$ is the deposition rate of the process with no RF bias, and $R_b$ is the deposition rate of the process with RF bias. During step 238, the second gas flow and the second RF bias are selected such that the trenches 14 are filled with the second layer of trench filling material 22 at a second etch/dep ratio.

The first etch/dep ratio is selected to be higher than the second etch/dep ratio. Thus, the first layer of trench filling material 20 is etched at a higher rate than the second layer of trench filling material 22. The first and second etch/dep ratios may be controlled in a number of suitable manners. For example, the first gas flow rate may be selected to be lower than the second gas flow rate. It will be understood by those having skill in the art that as the flow rate of the gas flow is increased the deposition rate will also increase. The first RF bias may be selected to be higher than the second RF bias. It will be understood that increasing the RF bias increases the rate at which the fill is etched. Thus, both the gas flow and the RF bias may be adjusted in order to control the etch/dep ratio. Generally, the first flow rate is selected to be lower than the second gas flow rate. Additionally, the first RF bias is generally selected to provide a relatively high rate of etch, and the second RF bias is selected to give a relatively low rate of etch for the given gas flows. For example, the first etch/dep ratio may be above about 0.3, and the second etch/dep ratio may be below about 0.3. However, it will be understood that the preferred etch/dep ratio is process dependent.

Figure 1B:
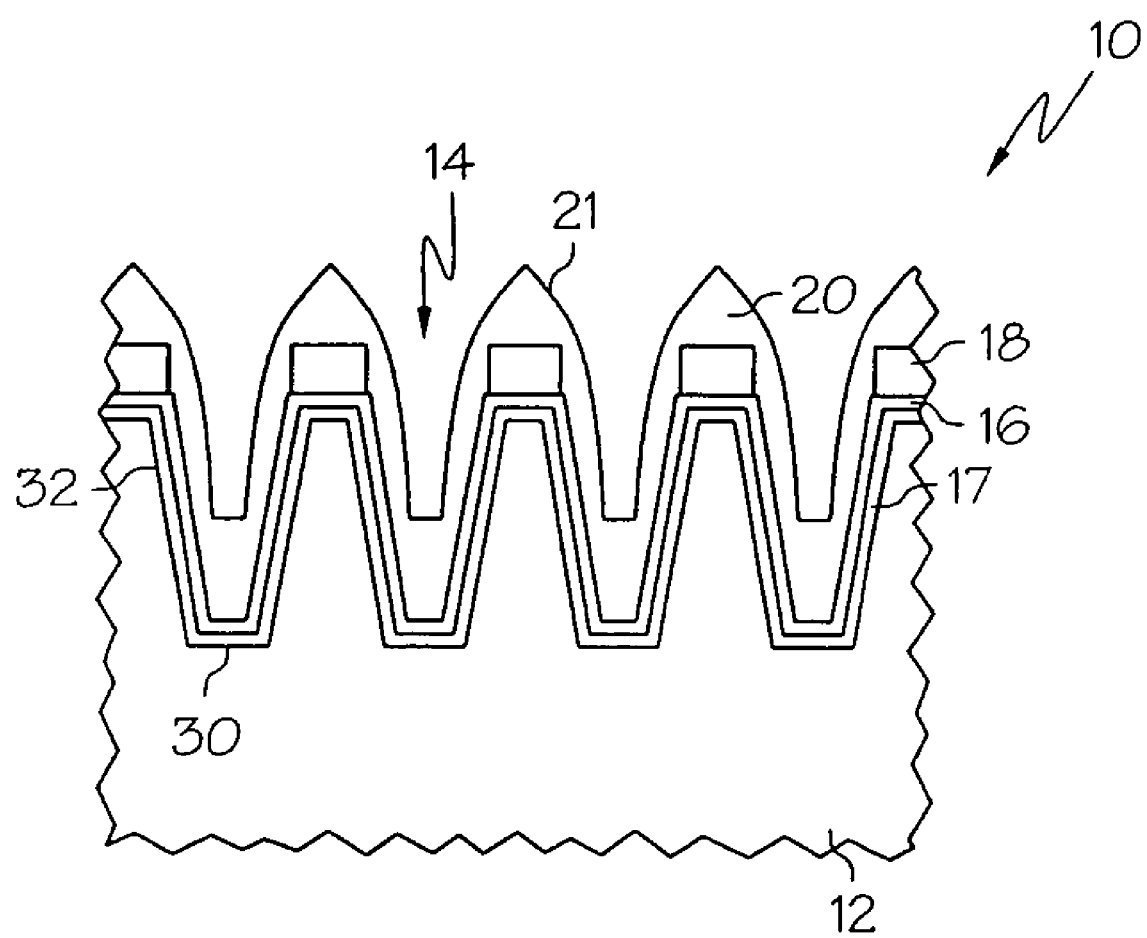

The first layer of trench filling material 20 may be deposited such that the first layer of trench filling material has a v-shaped upper surface profile 21, as shown in FIG. 1B. The v-shaped upper surface profile 21 occurs because the etch/dep ratio during the partial fill in step 230 is selected to be relatively high. Thus, the first layer of trench filling material 20 is subject to a relatively high etching rate. The v-shaped upper surface profile 21 reduces the aspect ratio of the trenches 14, and the second layer of trench filling material 22 may be deposited at a lower etch/dep ratio such that the trenches 14 are filled with the second layer of trench filling material 22 at a higher rate. When the first and second layers 20, 22 of trench filling material are deposited in this manner, the trench fill is substantially void free or has deeply buried voids.

Figure 1C:
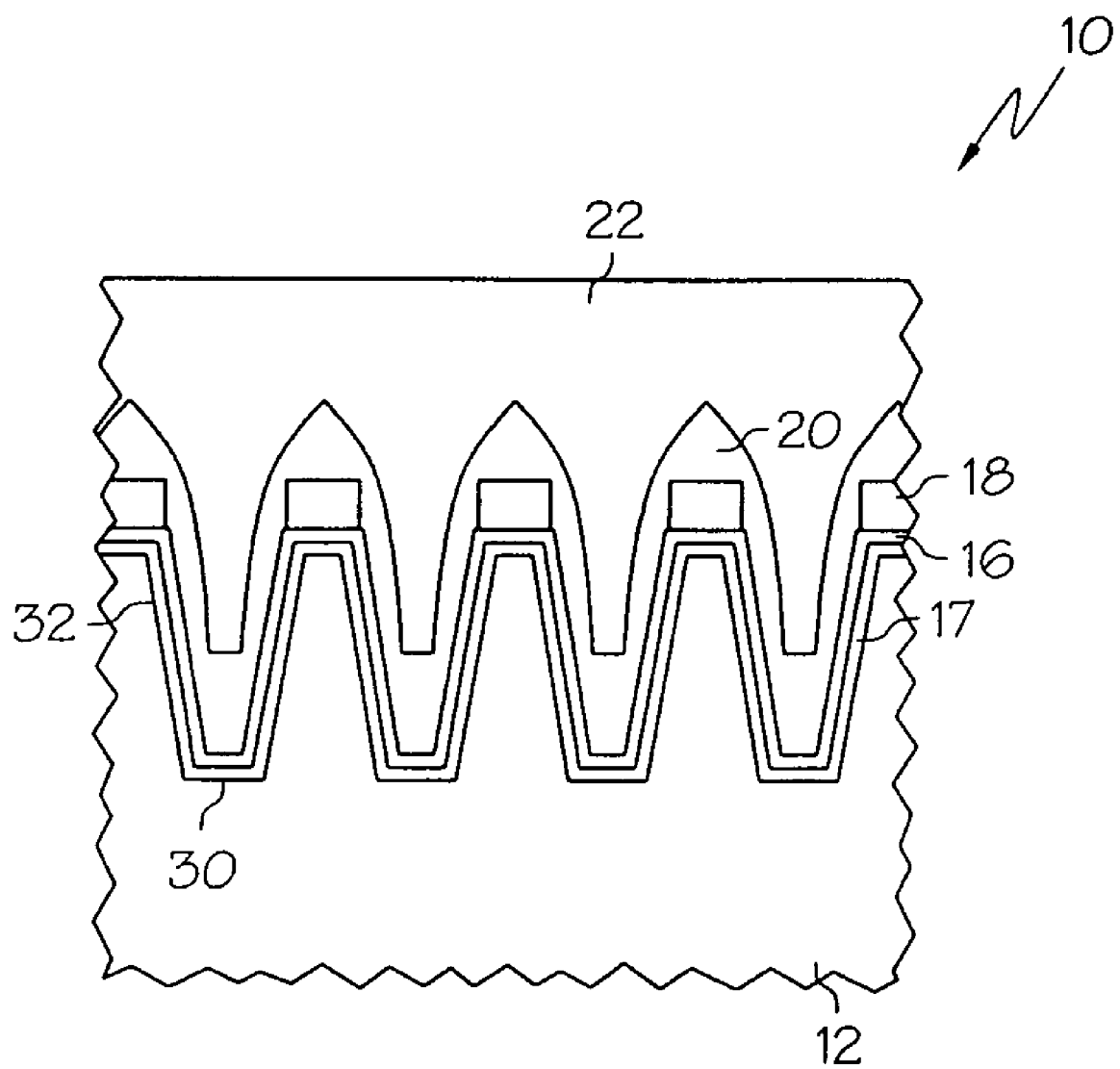
Figure 2:
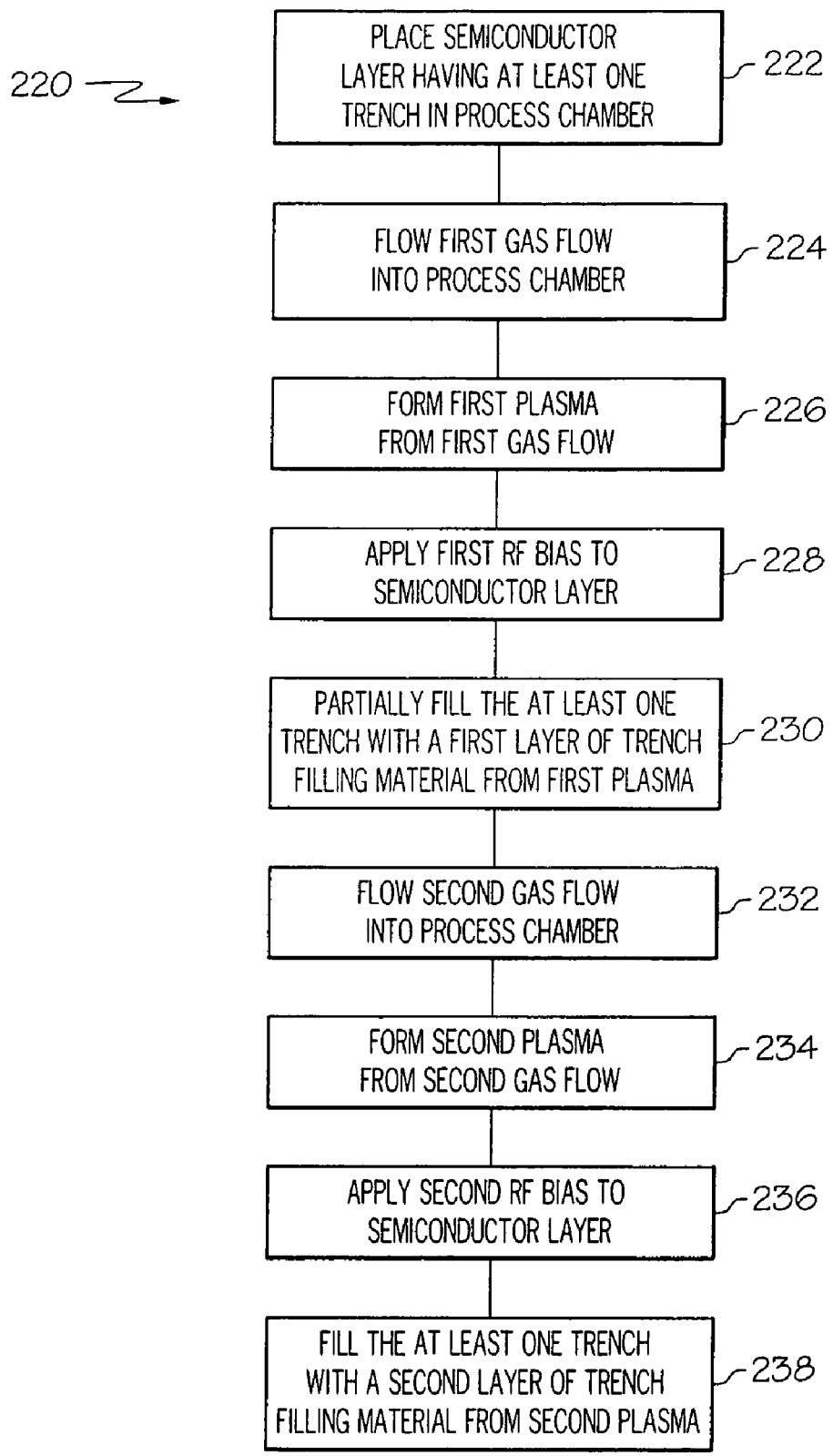
FIG. 2 is a flow diagram of process steps for filling trenches in accordance with an embodiment of the present invention.

When the trenches 14 are STI trenches as illustrated in FIGS. 1A-1C, the trenches may have a nitride liner layer 16 proximate to the bottom 30 and sidewalls 32 of the trenches 14. Additionally, the nitride liner layer 16 may underlie the nitride regions 18 next to the trenches 14. The second etch/dep ratio in step 238 is selected such that the second layer of trench filling material 22 may be deposited without causing the nitride liner layer 16 or the nitride regions 18 to be eroded by the etching of the second layer of trench filling material 22. Thus, the second etch/dep ratio is generally lower than the first etch/dep ratio as discussed above.

The first gas flow preferably comprises a silicon containing gas, an oxygen containing gas, and an inert gas. Thus, the first layer of trench filling material 20 preferably comprises silicon dioxide. For example, the first gas flow may comprise a silane gas, an oxygen gas, and an inert gas. The inert gas may be any suitable inert gas including, but not limited to, hydrogen gas, deuterium gas, helium gas, argon gas, and neon gas. In accordance with one embodiment, the first gas flow comprises a silane gas, an oxygen gas, and a hydrogen gas. When the first gas flow comprises a silane gas, an oxygen gas, and an inert gas, the silane gas flow rate may be from about 10 to about 35 standard cubic centimeters per minute (sccm). The oxygen gas flow rate may be from about 20 to about 65 sccm. When such gas flow rates are used, the first RF bias may be above about 1000 W. When the inert gas is hydrogen, the flow rate may be from about 100 to about 1200 sccm. When the inert gas is deuterium, the flow rate may be from about 100 to about 1200 sccm. When the inert gas is helium or argon, the flow rate may be from about 100 to about 500 sccm.

The second gas flow preferably comprises a silicon containing gas, an oxygen containing gas, and an inert gas, and the second layer of trench filling material 22 preferably comprises silicon dioxide. For example, the second gas flow may comprise a silane gas, an oxygen gas, and an inert gas. In accordance with one embodiment, the second gas flow comprises a silane gas, an oxygen gas, and a hydrogen gas. When the second gas flow comprises a silane gas, an oxygen gas, and an inert gas, the silane gas flow rate may be from about 35 to about 70 sccm. The oxygen gas flow rate may be from about 65 to about 100 sccm. When such gas flow rates are selected, the second RF bias may be below about 3000 W. When the inert gas is hydrogen, the flow rate may be from about 100 to about 1200 sccm. When the inert gas is deuterium, the flow rate may be from about 100 to about 1200 sccm. When the inert gas is helium or argon, the flow rate may be from about 100 to about 500 sccm.

In order that the invention may be more readily understood, reference is made to the following examples, which are intended to be illustrative of the invention, but are not intended to be limiting in scope.

EXAMPLE 1

Silicon dioxide was deposited in STI trenches on a wafer in accordance with an embodiment of the present invention using a Novellus Concept Two Speed® chamber available from Novellus Systems, Inc., San Jose, Calif. The first gas flow comprised silane gas having a flow rate of 70 sccm, oxygen gas having a flow rate of 98 sccm, and hydrogen gas having a flow rate of 170 sccm. The LFRF used to form the first plasma was 4500 W. The first RF bias was 2500 W. The wafer was exposed to the first plasma for 40 seconds, and the first layer of trench filling material was deposited. The second gas flow comprised silane gas having a 70 sccm, oxygen gas having a flow rate of 98 sccm, and hydrogen gas having a flow rate of 170 sccm. The LFRF used to form the second plasma was 4500 W. The second RF bias was 2000 W, and the wafer was exposed to the second plasma for about 100 seconds. The silicon dioxide deposited in the STI trenches exhibited some deeply buried voids. The nitride liner layer was not significantly eroded.

EXAMPLE 2

Silicon dioxide was deposited in STI trenches on a wafer in accordance with an embodiment of the present invention using a Novellus Concept Two Speed® chamber available from Novellus Systems, Inc., San Jose, Calif. The first gas flow comprised silane gas having a flow rate of 70 sccm, oxygen gas having a flow rate of 98 sccm, and hydrogen gas having a flow rate of 170 sccm. The LFRF used to form the first plasma was 4500 W. The first RF bias was 3000 W. The wafer was exposed to the first plasma for 40 seconds, and the first layer of trench filling material was deposited. The second gas flow comprised silane gas having a 70 sccm, oxygen gas having a flow rate of 98 sccm, and hydrogen gas having a flow rate of 170 sccm. The LFRF used to form the second plasma was 4500 W. The second RF bias was 2000 W, and the wafer was exposed to the second plasma for about 100 seconds. The silicon dioxide deposited in the STI trenches exhibited few deeply buried voids. The nitride liner layer was not significantly eroded.

EXAMPLE 3

Silicon dioxide was deposited in STI trenches on a wafer in accordance with an embodiment of the present invention using a Novellus Concept Two Speed® chamber available from Novellus Systems, Inc., San Jose, Calif. The first gas flow comprised silane gas having a flow rate of 70 sccm, oxygen gas having a flow rate of 98 sccm, and hydrogen gas having a flow rate of 170 sccm. The LFRF used to form the first plasma was 4500 W. The first RF bias was 3500 W. The wafer was exposed to the first plasma for 40 seconds, and the first layer of trench filling material was deposited. The second gas flow comprised silane gas having a 70 sccm, oxygen gas having a flow rate of 98 sccm, and hydrogen gas having a flow rate of 170 sccm. The LFRF used to form the second plasma was 4500 W. The second RF bias was 2000 W, and the wafer was exposed to the second plasma for about 100 seconds. The silicon dioxide deposited in the STI trenches exhibited very few deeply buried voids. The nitride liner layer was not significantly eroded. The higher etch/dep ratio during the deposition of the first layer of trench filling material provides a trench fill which exhibits smaller and more deeply buried voids.

It will be apparent to those skilled in the art that various changes may be made without departing from the scope of the invention, which is not to be considered limited to what is described in the specification.

What is claimed is:

1. A method for filling a trench in a semiconductor layer located in a process chamber comprising:

depositing a first layer of trench filling material in said trench under conditions establishing a first etch/dep ratio to partially fill said trench using a gas plasma; and
depositing a second layer of trench filling material in said trench to fill said trench under conditions establishing a second etch/dep ratio using a gas plasma;
wherein said first etch/dep ratio is higher than said second etch/dep ratio.

2. A method as claimed in claim 1 in which said first trench filling material is deposited in said trench by flowing a first gas into said process chamber and forming a first plasma from said gas.

3. A method as claimed in claim 2 including forming said first plasma by applying an RF bias in said process chamber.

4. A method as claimed in claim 3 wherein said first plasma is a high density plasma.

5. A method as claimed in claim 2 in which said second trench filling material is deposited in said trench by flowing a second gas into said process chamber and forming a second plasma from said gas.

6. A method as claimed in claim 5 including forming said second plasma by applying an RF bias in said process chamber.

7. A method as claimed in claim 6 wherein said second plasma is a high density plasma.

8. The method as claimed in claim 1 wherein said trench comprises a shallow trench isolation trench.

9. The method as claimed in claim 1 wherein said trench comprises an intemietal dielectric trench.

10. A method for filling a trench in a semiconductor layer located in a process chamber comprising:
depositing a first layer of trench filling material in said trench under conditions establishing a first etch/dep ratio to partially fill said trench using a gas plasma; and
depositing a second layer of trench filling material in said trench to fill said trench under conditions establishing a second etch/dep ratio using a gas plasma; wherein said trench has an aspect ratio between about 6:1 to about 10:1 and said first etch/dep ratio is higher than said second etch/dep ratio.

11. A method for filling a trench in a semiconductor layer located in a process chamber comprising:
flowing a first gas into said process chamber and forming a first plasma from said gas;
depositing a first layer of trench filling material in said trench under conditions establishing a first etch/dep ratio to partially fill said trench using said first plasma;
flowing a second gas into said process chamber and forming a second plasma from said gas; and
depositing a second layer of trench filling material in said trench to fill said trench under conditions establishing a second etch/dep ratio using a gas plasma; wherein the flow of said first gas is selected to have a rate of flow lower than a rate of flow of said second gas, and said first etch/dep ratio is higher than said second etch/dep ratio.

12. A method for filling a trench in a semiconductor layer located in a process chamber comprising:
flowing a first gas into said process chamber and forming a first plasma from said gas by applying a first RF bias in said chamber;
depositing a first layer of trench filling material in said trench under conditions establishing a first etch/dep ratio to partially fill said trench using said first plasma;
flowing a second gas into said process chamber and forming a second plasma from said gas by applying a second RF bias in said chamber; and depositing a second layer of trench filling material in said trench to fill said trench under conditions establishing a second etch/dep ratio using a gas plasma; wherein said first RF bias is higher than said second RF bias, and said first etch/dep ratio is higher than said second etch/dep ratio.

13. A method for filling a trench in a semiconductor layer located in a process chamber comprising:
flowing a first gas flow into said process chamber;
forming a first plasma from said first gas flow;
applying a first RF bias to said semiconductor layer, wherein said first gas flow and said first RF bias are selected such that said trench is partially filled with a first layer of trench filling material at a first etch/dep ratio;
flowing a second gas flow into said process chamber;
forming a second plasma from said second gas flow; and
applying a second RF bias to said semiconductor layer;
wherein:
said second gas flow and said second RF bias are selected such that said trench is filled with a second layer of trench filling material at a second etch/dep ratio;
said first etch/dep ratio is selected to be higher than said second etch/dep ratio; and
said first RF bias is higher than said second RF bias.

14. A method for filling a trench in a semiconductor layer located in a process chamber comprising:
flowing a first gas into said process chamber, said first gas comprising at least one first silicon containing gas, at least one first oxygen containing gas, and at least one first inert gas, and forming a first plasma from said gas;
depositing a first layer of trench filling material in said trench under conditions establishing a first etch/dep ratio to partially fill said trench using said first plasma, said first layer of trench filling material comprising silicon dioxide;
flowing a second gas into said process chamber, said second gas comprising at least one second silicon containing gas, at least one second oxygen containing gas, and at least one second inert gas, and forming a second plasma from said gas; and
depositing a second layer of trench filling material in said trench to fill said trench under conditions establishing a second etch/dep ratio using a gas plasma, said second layer of trench filling material comprising silicon dioxide;
wherein the flow of said first gas is selected to have a rate of flow lower than a rate of flow of said second gas, and said first etch/dep ratio is higher than said second etch/dep ratio.

15. A method as claimed in claim 14 wherein said first inert gas is selected from hydrogen, deuterium, argon, helium, and neon, and combinations thereof.

16. A method as claimed in claim 15 wherein said first inert gas comprises hydrogen.

17. A method as claimed in claim 14 wherein said second inert gas is selected from hydrogen, deuterium, argon, helium, and neon, and combinations thereof.

18. A method as claimed in claim 17 wherein said second inert gas comprises hydrogen.

19. A method for filling a trench in a semiconductor layer located in a process chamber comprising:
flowing a first gas into said process chamber, said first gas comprising a first silane gas, a first oxygen gas, and a first hydrogen gas, and forming a first plasma from said gas;

depositing a first layer of trench filling material in said trench under conditions establishing a first etch/dep ratio to partially fill said trench using said first plasma, said first layer of trench filling material comprising silicon dioxide;

flowing a second gas into said process chamber, said second gas comprising a second silane gas, a second oxygen gas, and a second hydrogen gas, and forming a second plasma from said gas; and depositing a second layer of trench filling material in said trench to fill said trench under conditions establishing a second etch/dep ratio using a gas plasma, said second layer of trench filling material comprising silicon dioxide;

wherein the flow of said first gas is selected to have a rate of flow lower than a rate of flow of said second gas, and said first etch/dep ratio is higher than said second etch/dep ratio.

20. A method as claimed in claim 19 wherein:
said first silane gas has a flow rate of between about 10 to about 35 sccm;
said first oxygen gas has a flow rate of between about 20 to about 65 sccm; and
said first hydrogen gas has a flow rate of between about 100 to about 1200 sccm.

21. A method as claimed in claim 19 wherein:
said second silane gas has a flow rate of between about 35 to about 70 sccm;
said second oxygen gas has a flow rate of between about 65 to about 100 sccm; and
said second hydrogen gas has a flow rate of between about 100 to about 1200 sccm.

22. A method of filling shallow trench isolation trenches in a semiconductor substrate located in a process chamber, comprising:
providing a series of shallow isolation trenches, wherein each of said trenches is defined by a pair of sidewalls and a trench bottom and has a nitride liner layer proximate to said sidewalls and said trench bottom;
depositing a first layer of trench filling material in said trenches under conditions establishing a first etch/dep ratio to partially fill said trenches using a gas plasma; and
depositing a second layer of trench filling material in said trenches to fill said trenches under conditions establishing a second etch/dep ratio using a gas plasma;
wherein said first etch/dep ratio is selected to be higher than said second etch/dep ratio; said nitride liner layer is not substantially eroded during the filling of said shallow isolation trenches with said first layer of trench filling material; and said nitride liner layer is not substantially eroded during the filling of said shallow isolation trenches with said second layer of trench filling material.

23. A method of filling trenches in a semiconductor layer by HDP-CVD comprising:
depositing a first layer of trench filling material in said trench under conditions establishing a first etch/dep ratio to partially fill said trench using a gas plasma; and
depositing a second layer of trench filling material in said trench to fill said trench under conditions establishing a second etch/dep ratio using a gas plasma;
wherein said first etch/dep ratio is higher than said second etch/dep ratio.

24. A method as claimed in claim 23 wherein said first etch/dep ratio is selected to be above about 0.3.

25. A method as claimed in claim 23 wherein said second etch/dep ratio is selected to be below about 0.3.

26. A method of filling trenches in a semiconductor layer by HDP-CVD comprising:
flowing a first gas into said process chamber, said first gas comprising at least one first silicon containing gas, at least one first oxygen containing gas, and at least one first inert gas, and forming a first plasma from said gas;
depositing a first layer of trench filling material in said trench under conditions establishing a first etch/dep ratio to partially fill said trench using said first plasma, said first layer of trench filling material comprising silicon dioxide;
flowing a second gas into said process chamber, said second gas comprising at least one second silicon containing gas, at least one second oxygen containing gas, and at least one second inert gas, and forming a second plasma from said gas; and
depositing a second layer of trench filling material in said trench to fill said trench under conditions establishing a second etch/dep ratio using a gas plasma, said second layer of trench filling material comprising silicon dioxide;
wherein the flow of said first gas is selected to have a rate of flow lower than a rate of flow of said second gas, and said first etch/dep ratio is higher than said second etch/dep ratio.

\* \* \* \* \*

UNITED STATES PATENT AND TRADEMARK OFFICE
CERTIFICATE OF CORRECTION

PATENT NO. : 7,259,079 B2 Page 1 of 1
APPLICATION NO. : 11/047476
DATED : August 21, 2007
INVENTOR(S) : Bai et al.

It is certified that error appears in the above-identified patent and that said Letters Patent is hereby corrected as shown below:

In column 7, line 29, in Claim 9, delete "intemietal" and insert -- intermetal --, therefor.

In column 9, line 46, in Claim 22, delete "plasma:" and insert -- plasma; --, therefor.

Signed and Sealed this

Twentieth Day of November, 2007

JON W. DUDAS
*Director of the United States Patent and Trademark Office*